(12) United States Patent
Lin et al.

(10) Patent No.: US 6,509,646 B1
(45) Date of Patent: Jan. 21, 2003

(54) APPARATUS FOR REDUCING AN ELECTRICAL NOISE INSIDE A BALL GRID ARRAY PACKAGE

(75) Inventors: Wei-Feng Lin, Hsinchu (TW); Chung-Ju Wu, Kaohsiung (TW); Chen-Wen Tsai, Hsinchu (TW)

(73) Assignee: Silicon Integrated Systems Corp., Hsin-chu (TW)

( * ) Notice: Subject to any disclaimer, the term of this patent is extended or adjusted under 35 U.S.C. 154(b) by 0 days.

(21) Appl. No.: 09/575,637

(22) Filed: May 22, 2000

(51) Int. Cl.[7] .............................................. H01L 21/302
(52) U.S. Cl. ........................ 257/738; 257/778; 257/779; 257/780; 438/108; 438/612; 438/613
(58) Field of Search ................................ 257/738, 778, 257/779, 780; 438/108, 612, 613

(56) References Cited

U.S. PATENT DOCUMENTS

| | | | |
|---|---|---|---|
| 5,801,432 A | * 9/1998 | Rostoker et al. | ............ 257/738 |
| 5,825,628 A | * 10/1998 | Garbelli et al. | ............. 257/738 |
| 5,854,085 A | * 12/1998 | Raab et al. | .................. 437/211 |
| 6,201,298 B1 | * 3/2001 | Sato et al. | .................... 257/780 |
| 6,369,443 B1 | * 4/2002 | Baba | ........................... 257/778 |

* cited by examiner

Primary Examiner—John F. Niebling
Assistant Examiner—Lynne A. Gurley
(74) Attorney, Agent, or Firm—Ladas & Parry

(57) ABSTRACT

An apparatus for reducing an electrical noise inside a ball grid array package is disclosed. The apparatus mainly comprises a substrate, a plurality of solder balls and a plurality of inside-connected capacitors. The substrate includes a contact layer, a power plane and a ground plane. The plurality of solder balls are fixed on the contact layer. The plurality of inside-connected capacitors are fixed on the contact layer, and a conductive glue is used to electrically connect the capacitors to the power plane and ground plane to reduce the electrical noise between the power plane and ground plane.

7 Claims, 4 Drawing Sheets

APPARATUS FOR REDUCING AN ELECTRICAL NOISE INSIDE A BALL GRID ARRAY PACKAGE

BACKGROUND OF THE INVENTION

1. Field of the Invention

The present invention relates to an apparatus for reducing electrical noise inside a ball grid array package, and particularly to an apparatus for embedding a plurality of capacitors on a power plane and ground plane inside a ball grid array package by semiconductor package technology.

2. Description of Related Art

For the progress of semiconductor process technology, hundreds of thousands or even millions of transistors are built inside an integrated circuit. If the plurality of transistors are working simultaneously, such as turning on or turning off simultaneously, a pulse effect and electrical noise will be created for power supply and make computing results of the integrated circuit unstable.

For resolving the problem of the unstable voltage and electrical noise for power supply, a prior method fixes a plurality of capacitors on the circuit board, to eliminate the electrical noise. FIG. 1 is a top view of a prior plastic ball grid array (PBGA) package. The plastic ball grid array package 11 is fixed on a circuit board 13. A plurality of outside-connected capacitors 12 is provided around the plastic ball grid array package 11. Each outside-connected capacitors is electrically connected to a power plane and ground plane of the plastic ball grid array package 11 to eliminate an electrical noise induced between the power plane and ground plane.

The prior method requires a lot of capacitors of different sizes and different kinds on the circuit board 13. The prior method is not only costly but also requires a large area of the circuit board. Moreover, the prior method is not suitable for use in the modem tendency of compactness.

SUMMARY OF THE INVENTION

Accordingly, the object of the present invention is to resolve the drawbacks of high cost and large area occupied as in the prior art. In order to accomplish the object, the present invention proposes an apparatus for reducing an electrical noise inside a ball grid array package. The apparatus fixes a plurality of inside-connected capacitors on a substrate of the apparatus by semiconductor packaging technology, and the plurality of inside-connected capacitors is directly, or through vias, connected to the power plane and ground plane of the apparatus to efficiently achieve the purpose of providing a stable voltage and filtering the electrical noise.

The apparatus of the present invention for reducing an electrical noise inside a ball grid array package mainly comprises a substrate, a plurality of solder balls and a plurality of inside-connected capacitors. The substrate includes a contact layer, a power plane and a ground plane. The plurality of solder balls are fixed on said contact layer. The plurality of inside-connected capacitors are fixed on said contact layer, and a conductive glue is used to electrically connect the capacitors to the power plane and ground plane to reduce the electrical noise between the power plane and ground plane.

BRIEF DESCRIPTION OF THE DRAWINGS

The present invention will be described according to the appended drawings in which.

PREFERRED EMBODIMENT OF THE PRESENT INVENTION

Figure 1:
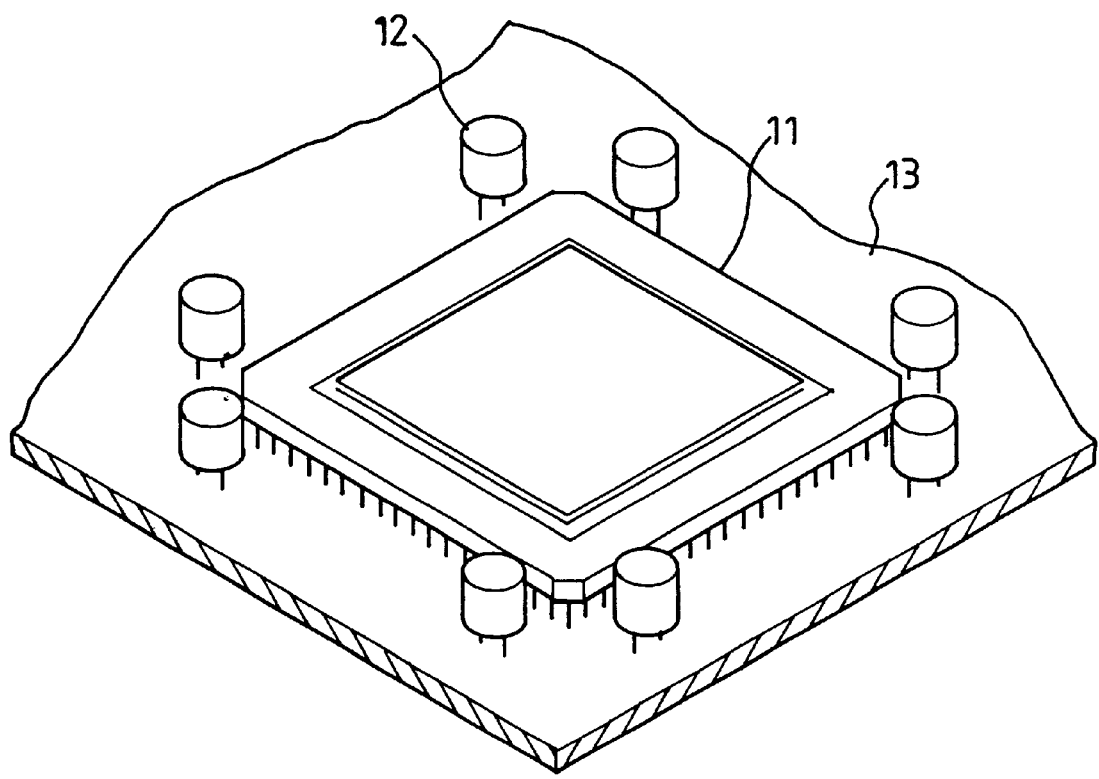
FIG. 1 is a top view of a prior ball grid array package.
Figure 2:
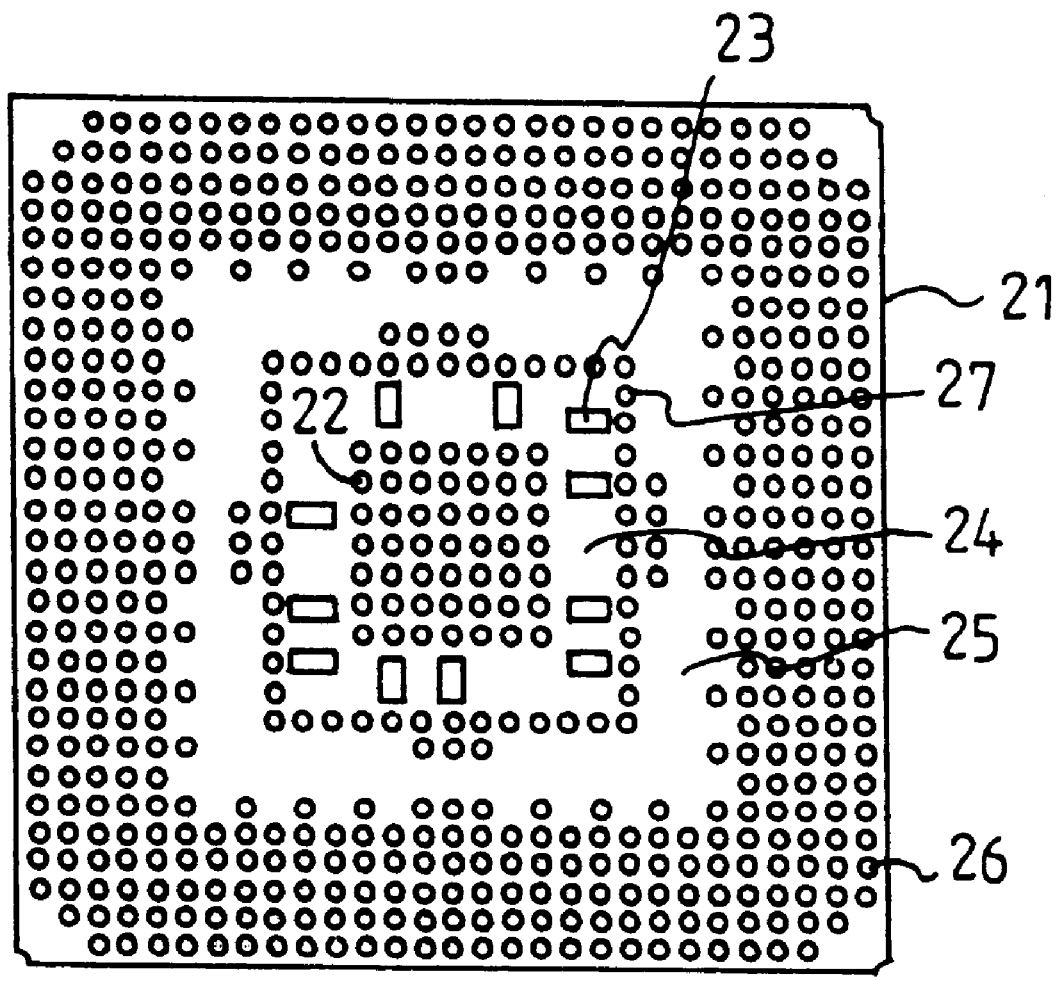
FIG. 2 is a cross-sectional of an apparatus according to a first preferred embodiment of the present invention.

FIG. 2 is a cross-sectional view of an apparatus for reducing electrical noise inside a ball grid array package according to a first preferred embodiment of the present invention. The apparatus of the present invention comprises a substrate 30. A ground plane 24 is situated on the central part of the substrate 30, and a plurality of ground balls 22 are situated on the top of the ground plane 24. A power plane 25 is around the ground plane 24, and a plurality of power balls 27 are situated on the top of the power plane 25. A plurality of inside-connected capacitors 23 are fixed above the substrate 30 and electrically connected to the ground plane 24 and power plane 25. The function of the inside-connected capacitors 23 is similar to the function of the outside-connected capacitors 12 shown in FIG. 1 and can provide stable voltage and filter electrical noise. A plurality of signal balls 26 are situated outside the power plane 25. In this application, the ground ball 22, power ball 27 and signal ball 26 are all called "solder balls." The plurality of ground balls 22, power balls 27 and signal balls 26 can transmit or receive electrical signals from a circuit board 13 connected to the apparatus, and release thermal energy inside the apparatus to the circuit board 13. The voltage level of the ground plane 24 is represented by symbol $V_{ss}$, which is usually 0 Voltage in a digital integrated circuits. The voltage level of the power plane 25 is represented by symbol $V_{dd}$, which is usually 3.3 Voltage in a digital integrated circuits. Because the inside-connected capacitors 23 are embedded in the apparatus 21 by semiconductor packaging technology. Thus, the apparatus 21 will cost less and occupies less area than the prior art apparatus. The inside-connected capacitors 23 are not limited to a particular material. Whatever the capacitors suitable for semiconductor packaging technology can be applied. A possible inside-connected capacitors packaging method is to fix the inside-connected capacitors 23 between the power plane 25 and the ground plane 24 by a machine which executes surface mount technology after the packaging process of ball placement.

Figure 3:
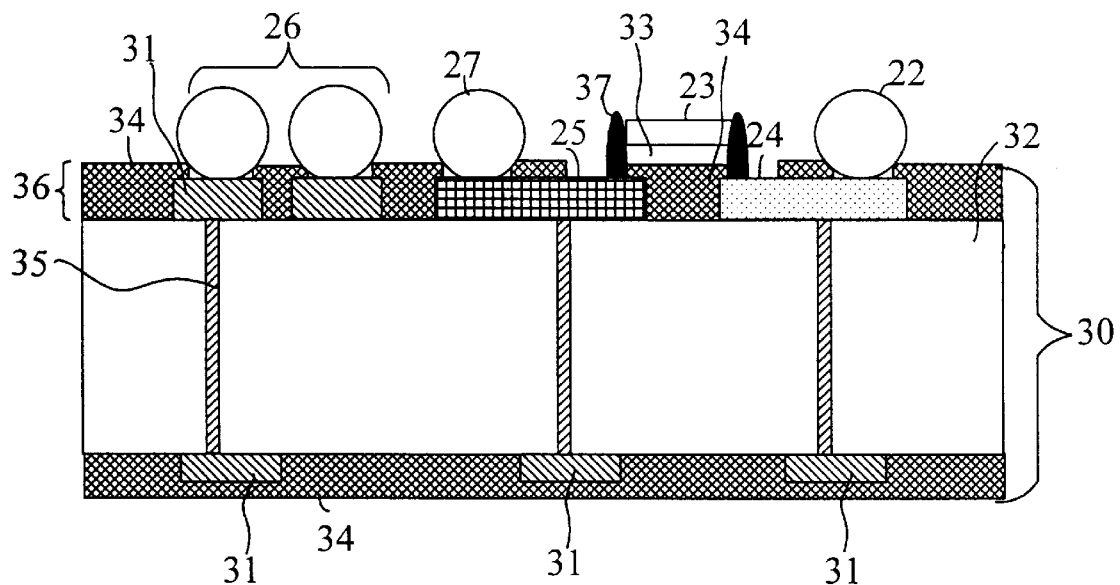
FIG. 3 is a cross-sectional view of an apparatus according to a second preferred embodiment of the present invention.

FIG. 3 is a cross-sectional view of an apparatus for reducing electrical noise inside a ball grid arry package according to a second preferred embodiment of the present invention. The apparatus 21 of the second embodiment has two layers. The first layer is a contact layer 36 comprising the power plane 25 and the ground plane 24. A solder mask 34 is used to isolate the power plane 25 from the ground plane 24. The second layer is a signal layer 31 for transmitting electrical signals. The second layer is not limited to a particular material, such as copper. An insulating plane 32 is used to isolate the first layer from the second layer. The insulating plane is not limited to a particular materical, and a BT resin can be used. The signal plane 31 is connected to the power plane 25 or ground plane 24 through vias 35 embedded a conductive material to achieve the function of signal transmission. The inside-connected capacitors 23 can be fixed on the contact layer 36 by an adhesive glue 33, whose material is not limited. A red glue can be used as an adhesive glue. The inside-connected capacitors 23 can be electrically connected between the power plane 25 and ground plane 24 by a conductive glue 37, whose material is not limited. An alloy containing tin and lead can be used. The ground balls 22 and the power balls 27 with signal balls 26 are situated at both sides of the inside-connected capacitors respectively. It is important that the height of the inside-connected capacitors should be less than the height of the solder balls to avoid bad conductivity between the apparatus 21 of the second embodiment and the circuit board 13 due to insufficient conductive area.

Figure 4:
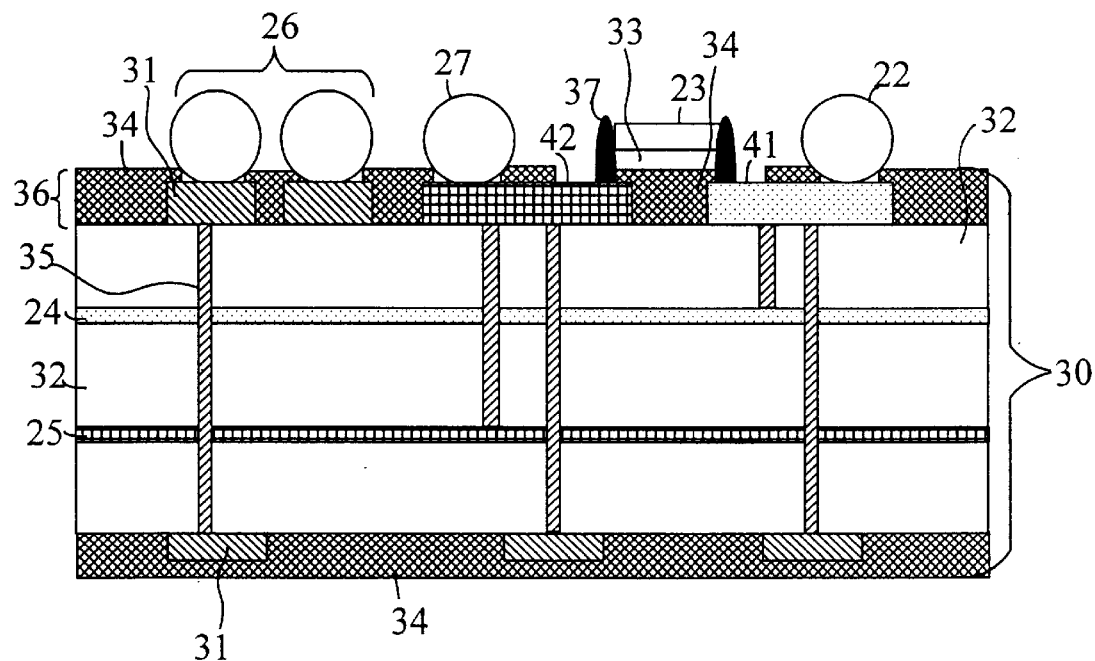
FIG. 4 is a cross-sectional view of an apparatus according to a third preferred embodiment of the present invention.

FIG. 4 is a cross-sectional view of an apparatus according to a third preferred embodiment of the present invention, and the apparatus 21 of the third embodiment has four layers, but also can apply in other multi-layer structures. A disadvantage of the two-layer structure shown as FIG. 3 in that the location of the power plane 25 and ground plane 24 are limited to a specific region, the inside-connected capacitors are therefore limited to the specific region. In other words, although the two-layer structure has the advantage of low cost, it has a disadvantage of inflexibility. It is a trend to design a multi-layer structure in modern ball grid array packaging technology. Therefore, the inside-connected capacitors could be placed on spare regions of the apparatus 21 of the third embodiment to increase the utilization of the apparatus 21. Besides, where the inside-connected capacitors are can be in the positive or negative side of the substrate 30, and the present invention does not limit it. As shown in FIG. 4, the contact layer 36, the power plane 25 and ground plane 24 are situated on different layers of the apparatus 21. The power plane 25 and ground plane 24 can be electrically connected to the contact layer 36 through vias 35 within which a conductive material is embedded. The inside-connected capacitors 23 are fixed on the contact layer 36 by adhesive glue 33, and electrically connected to positions 41 and 42 inside the contact layer 36 by conductive glue 37. The positions 41 and 42 are electrically connected to the ground plane 24 and power plane 25 by the vias 35 eliminate electrical noises between the power plane 25 and ground plane 24.

Figure 5:
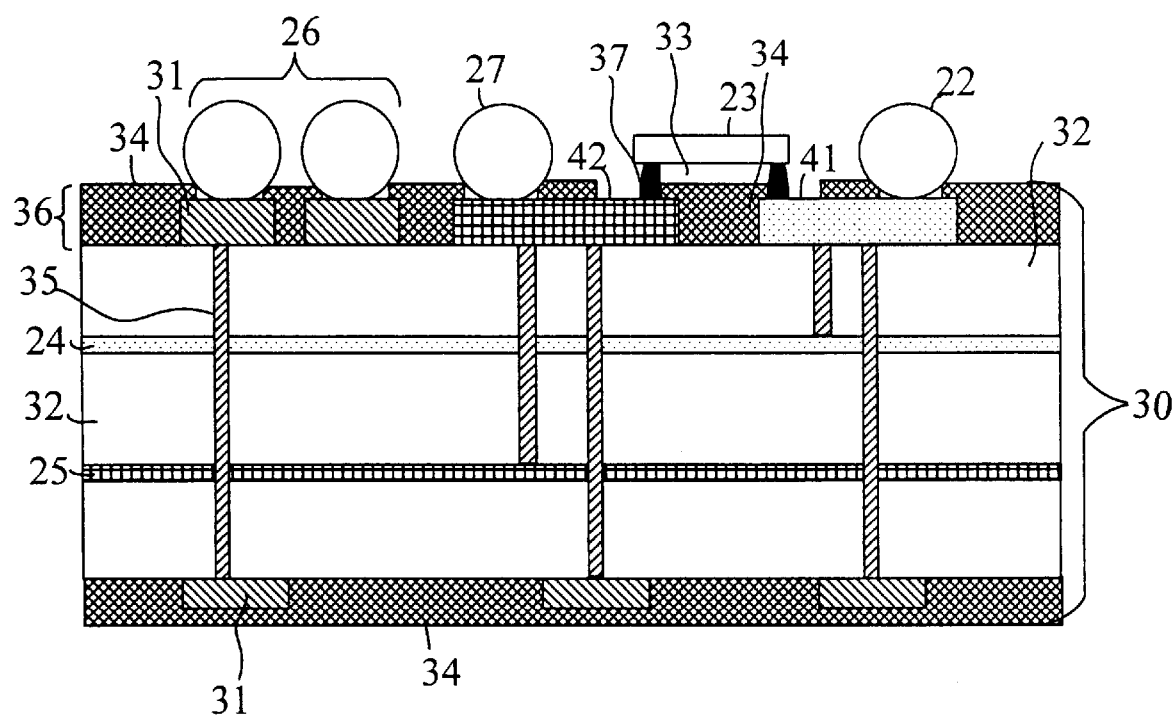
FIG. 5 is a cross-sectional diagram of an apparatus according to a fourth preferred embodiment of the.present invention.

FIG. 5 is a cross-sectional view of an apparatus according to a fourth preferred embodiment of the present invention, the apparatus 21 of the embodiment has four layers, but also can apply in 2-layer or other multi-layer structures. The conductive glue 37 in FIG. 5 is under the inside-connected capacitor 23, but the conductive glue 37 in FIG. 4 is beside the inside-connected capacitor 23. The function of the conductive glue in both FIG. 4 and FIG. 5 is to electrically connect the inside-connected capacitor 23 to the power plane 25 and the ground plane 24. There are some differences for the structures of FIG. 4 and FIG. 5 in packaging process and sequences. In packaging process, the structure in FIG. 4 is firstly to adhere the inside-connected capacitor 23 on the contact layer 36, and then uses the conductive glue 37 to electrically connect the inside-connected capacitor 23 to the power plane 25 and the ground plane 24. The structure in FIG. 5 is firstly to adhere the conductive glue 37 on the power plane 25 and the ground plane 24, then to fix the inside-connected capacitor 23 on the conductive glue 37, and the inside-connected capacitor 23, the power plane 25 and the ground plane 24 are therefore electrically connected.

The above-described embodiments of the present invention are intended to be illustrated only. Numerous alternative embodiments may be devised by those skilled in the art without departing from the scope of the following claims.

What is claimed is:

1. An apparatus for reducing an electrical noise inside a ball grid array package, comprising:

a substrate including a contact layer, a power plane and a ground plane;

a plurality of solder balls fixed on said contact layer; and a plurality of inside-connected capacitors fixed on said contact layer and electrically connected to said power plane and said ground plane by using a conductive glue to reduce an electrical noise between said power plane and ground plane.

2. The apparatus of claim 1, further comprising an adhesive glue for fixing said plurality of inside-connected capacitors on said contact layer.

3. The apparatus of claim 1, wherein said contact layer, said power plane and said ground plane are situated on different layers of said substrate respectively, and said contact layer is electrically connected to said power plane and ground plane through a plurality of vias.

4. The apparatus of claim 3, wherein said plurality of inside-connected capacitors can be fixed freely on any region of said contact layer.

5. The apparatus of claim 1, wherein said power plane and ground plane are a part of said contact layer, and said plurality of inside-connected capacitors are directly coupled to said power plane and ground plane through a conductive glue.

6. The apparatus of claim 1, wherein the height of said plurality of inside-connected capacitors is less than the height of said plurality of solder balls.

7. The apparatus of claim 1, wherein said plurality of inside-connected capacitors are fixed on said contact layer by surface mount technology.

* * * * *